(12) United States Patent
Anderson et al.

(10) Patent No.: US 10,742,218 B2
(45) Date of Patent: Aug. 11, 2020

(54) VERTICAL TRANSPORT LOGIC CIRCUIT CELL WITH SHARED PITCH

(71) Applicant: International Business Machines Corporation, Armonk, NY (US)

(72) Inventors: Brent A. Anderson, Jericho, VT (US); Albert Chu, Nashua, NH (US)

(73) Assignee: International Business Machines Corpoartion, Armonk, NY (US)

(*) Notice: Subject to any disclaimer, the term of this patent is extended or adjusted under 35 U.S.C. 154(b) by 0 days.

(21) Appl. No.: 16/042,927

(22) Filed: Jul. 23, 2018

(65) Prior Publication Data
US 2020/0028513 A1 Jan. 23, 2020

(51) Int. Cl.
*H03K 19/20* (2006.01)
*H01L 27/118* (2006.01)
*H03K 19/0948* (2006.01)

(52) U.S. Cl.
CPC ........ *H03K 19/20* (2013.01); *H01L 27/11807* (2013.01); *H03K 19/0948* (2013.01); *H01L 2027/11851* (2013.01)

(58) Field of Classification Search
None
See application file for complete search history.

(56) References Cited

U.S. PATENT DOCUMENTS

| | | |
|---|---|---|
| 4,908,772 A | 3/1990 | Chi |
| 5,313,079 A | 5/1994 | Brasen et al. |
| 5,625,568 A | 4/1997 | Edwards et al. |
| 6,505,328 B1 | 1/2003 | Van Ginneken et al. |
| 7,178,122 B2 | 2/2007 | Kishibe |
| 7,979,828 B2 | 7/2011 | Kuesel et al. |
| 9,570,357 B2 | 2/2017 | Anderson et al. |
| 9,614,087 B1 * | 4/2017 | Cheng ................. H01L 29/7827 |
| 9,680,473 B1 * | 6/2017 | Anderson ........... H01L 27/0207 |
| 9,761,712 B1 | 9/2017 | Anderson et al. |
| 9,786,788 B1 * | 10/2017 | Anderson ......... H01L 29/78642 |
| 9,859,898 B1 * | 1/2018 | Anderson ........ H03K 19/17796 |
| 9,899,515 B1 | 2/2018 | Cheng et al. |
| 10,325,821 B1 * | 6/2019 | Hook .................. H01L 27/1203 |
| 2007/0161162 A1 | 7/2007 | Jeng |

(Continued)

FOREIGN PATENT DOCUMENTS

WO PCT/IB2019/056154 11/2019

OTHER PUBLICATIONS

Intel, "Leading at the Edge—Technology and Manufacturing Day Glossary," Intel, Mar. 28, 2017, 3 pages.

*Primary Examiner* — Crystal L Hammond
(74) *Attorney, Agent, or Firm* — Vazken Alexanian; Ryan, Mason & Lewis, LLP

(57) ABSTRACT

A semiconductor structure includes a vertical transport logic circuit cell. The vertical transport logic cell includes a first logic gate and at least a second logic gate. The first logic gate includes at least one input terminal and at least one output terminal. The second logic gate includes at least one input terminal and at least one output terminal. One of the input terminal and the output terminal of the first logic gate shares a pitch of the vertical transport logic circuit cell with one of the input terminal and the output terminal of the second logic gate. The first and second logic gates can include the same type or different types of logic functions.

25 Claims, 5 Drawing Sheets

(56) References Cited

U.S. PATENT DOCUMENTS

| | | | |
|---|---|---|---|
| 2007/0200182 A1* | 8/2007 | Liaw | G11C 11/412 257/393 |
| 2008/0169487 A1* | 7/2008 | Shimbo | H01L 27/0207 257/207 |
| 2009/0173982 A1 | 7/2009 | Manning et al. | |
| 2013/0270614 A1 | 10/2013 | Yamasaki | |
| 2013/0334613 A1* | 12/2013 | Moroz | G06F 17/5072 257/401 |
| 2015/0206555 A1* | 7/2015 | Yang | G11C 5/025 365/51 |
| 2016/0365424 A1 | 12/2016 | Basker et al. | |
| 2018/0151583 A1* | 5/2018 | Lupino | H01L 27/0688 |

\* cited by examiner

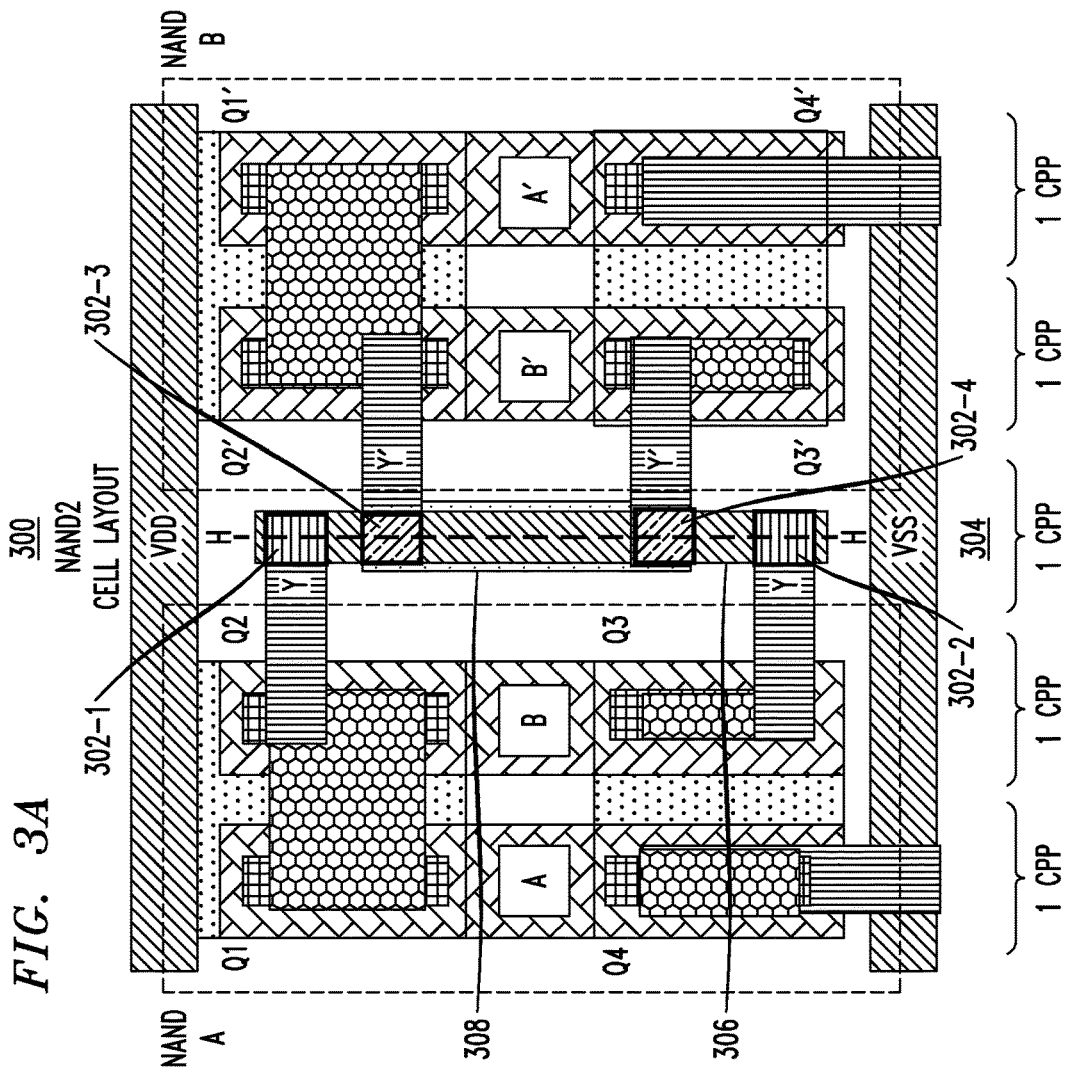

VERTICAL TRANSPORT LOGIC CIRCUIT CELL WITH SHARED PITCH

BACKGROUND

The present application relates to semiconductor devices comprising field effect transistors and, more specifically, to semiconductor devices comprising vertical transport field effect transistors.

Digital logic circuits, also referred to as logic gates, are the building blocks of digital electronics and integrated circuits. Some fundamental logic circuits can include, among others, NAND and NOR circuits, wherein an accompanying number, such as the "2" in NAND2, can indicate the number of active gates in the logic circuit (e.g., two NAND gates in a NAND2 logic circuit). However, each active gate in a logic circuit can perform a different logical operation. In a standard cell library, a number of transistors can be connected either in series and/or in parallel to perform NAND, NOR and other complex Boolean functions.

SUMMARY

Embodiments provide improved layouts for logic circuit cells through shared pitch areas.

In one embodiment, a semiconductor structure comprises a vertical transport logic circuit cell. The vertical transport logic cell comprises a first logic gate and at least a second logic gate. The first logic gate comprises at least one input terminal and at least one output terminal. The second logic gate comprises at least one input terminal and at least one output terminal. One of the input terminal and the output terminal of the first logic gate shares a pitch of the vertical transport logic circuit cell with one of the input terminal and the output terminal of the second logic gate.

In another embodiment, an integrated circuit comprises one or more vertical transport logic circuit cells. At least one of the one or more vertical transport logic circuit cells comprises a first logic gate and at least a second logic gate. The first logic gate comprises at least one input terminal and at least one output terminal. The second logic gate comprises at least one input terminal and at least one output terminal. One of the input terminal and the output terminal of the first logic gate shares a pitch of the vertical transport logic circuit cell with one of the input terminal and the output terminal of the second logic gate.

In a further illustrative embodiment, a method for fabricating a semiconductor structure comprises, in a vertical transport logic circuit cell comprising a first logic gate and at least a second logic gate, wherein the first logic gate comprises at least one input terminal and at least one output terminal, and the second logic gate comprises at least one input terminal and at least one output terminal, sharing a pitch of the vertical transport logic circuit cell between one of the input terminal and the output terminal of the first logic gate and one of the input terminal and the output terminal of the second logic gate.

In yet another illustrative embodiment, a semiconductor structure comprises a vertical transport logic circuit cell. The vertical transport logic cell comprises a first logic gate and at least a second logic gate. The first logic gate and the second logic gate share a pitch of the vertical transport logic circuit cell.

BRIEF DESCRIPTION OF THE DRAWINGS

FIG. 3A depicts a plan view of a layout of a NAND2 cell, according to an embodiment of the invention.

FIG. 3B depicts a cross-sectional view taken along the line H-H in the plan view of the NAND2 cell of FIG. 3A, according to an embodiment of the invention.

DETAILED DESCRIPTION

Figure 1:
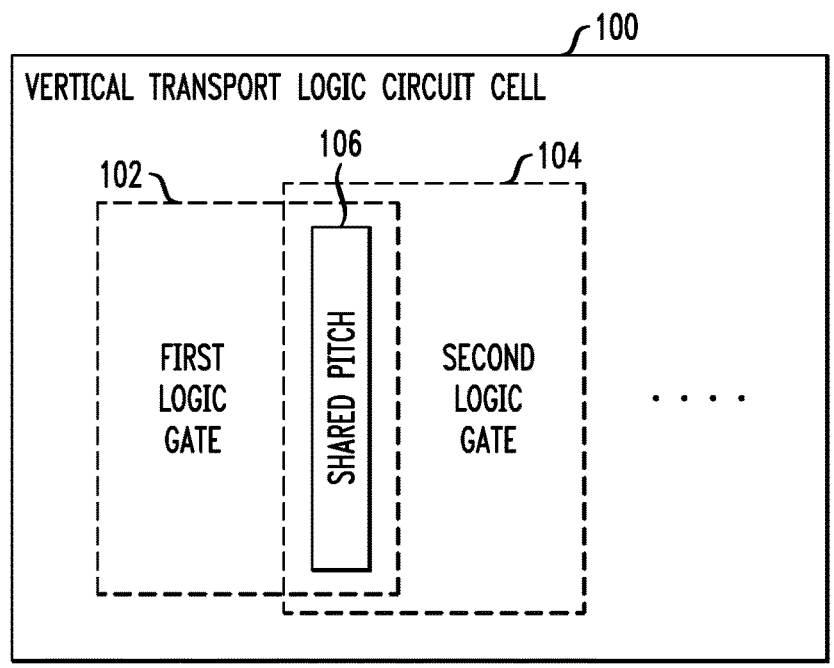
FIG. 1 depicts a block diagram of a vertical transport logic circuit cell with two logic gates sharing a pitch area, according to an embodiment of the invention.

Illustrative embodiments of the invention may be described herein in the context of illustrative methods for forming vertical transport logic gates with improved layouts. In particular, illustrative embodiments will be described herein in the context of improved layouts for a NAND2 cell. However, it is to be understood that embodiments of the invention are not limited to the illustrative methods, apparatus, systems, structures and devices but instead are more broadly applicable to other suitable methods, apparatus, systems, structures and devices.

Complementary metal oxide semiconductor (CMOS) technology is currently the dominant technology for the manufacture of logic gates used in digital integrated circuits, including microprocessors, microcontrollers, or static random access memory (SRAM). A field effect transistor (FET) is one example of a semiconductor device using CMOS technology that can be used for amplifying or switching electronic signals. A FET has source, drain, and gate electrodes. The gate electrode typically comprises a conductive gate that is electrically insulated from the main semiconductor n-channel or p-channel by a thin layer of insulating material. A gate voltage controls whether the path from drain to source is an open circuit ("off") or a resistive path ("on").

Vertical transport FETs (VTFETs) are a promising alternative to standard lateral FET structures due to potential benefits, among others, in terms of reduced circuit footprint. In this type of structure, the current flow is perpendicular to a supporting wafer, unlike the lateral current flow in lateral FETs. A logic circuit comprising VTFETs is referred to as a "vertical transport logic gate." VTFETs can potentially provide electronic devices comprising logic circuits with improved circuit density. Such logic circuits can be characterized by a lower-number CPP (contacted polysilicon (or poly) pitch) versus comparable logic circuits comprising lateral FET layouts. Standard logic cells used in integrated circuits have a height that is related to MMP (minimum metal pitch) and a width that is related to CPP. CPP, also known as transistor gate pitch, is a measure of the spacing between the gates within the standard logic cell. The MMP and CPP of standard cells provides a density metric, offering for example, an indication of the area size required for a given number of cells to be placed on an integrated circuit chip.

Logic cells, such as for example, NAND gates and NOR gates, may be provided as pre-laid out library cells as part of a cell library to be used for a specific integrated circuit manufacturing process. Each logic cell from the cell library has a given cell area determined as a function of MMP and CPP, thereby providing the number of such logic cells that can be placed on an integrated circuit chip of a particular size. There is a need, therefore, to reduce the area required for each logic cell in order to increase the amount of logic that can be placed on the integrated circuit chip.

Continued efforts are being made to design integrated circuit chips having the greatest possible number of individual cells, in order to provide the integrated circuit chip with as much memory or other computing resource as possible within the available area thereon. To achieve this goal, integrated circuit designers have been developing layouts for the transistors making up the cells to reduce the area required for each. Embodiments provide improved layouts for cells, while also reducing feature size and the number of CPPs resulting in improved manufacturability and reduced cell size.

FIG. 1 shows a block diagram of a vertical transport logic cell 100 having a reduced area, according to an illustrative embodiment. More particularly, FIG. 1 shows vertical transport logic cell 100 with a first logic gate 102 and a second logic gate 104 that share a contacted poly pitch (CPP), referred to herein as a shared pitch 106. The first logic gate 102 and the second logic gate 104 each have an area requirement, which may be referred to in terms of a particular number of CPPs. By having the first logic gate 102 and the second logic gate 104 include a shared pitch 106 (e.g., where at least one CPP of the first logic gate 102 is shared with at least one CPP of the second logic gate 104), significant savings in terms of area is achieved. Additional details regarding illustrative implementations of shared pitch 106 will be described in further detail below.

The first logic gate 102 and the second logic gate 104 can be any type of logic gate. For example, in some embodiments, the first logic gate 102 and the second logic gate 104 can independently be an inverter logic gate, a NAND logic gate, an AND logic gate, a NOR logic gate, an OR logic gate, an AND-OR logic gate, an OR-AND logic gate, a buffer logic gate, a flip-flop logic gate, a multiplexer logic gate, etc. In other words, the first logic gate 102 may be of a first type and the second logic gate 104 may be of a second type. The first and second types may be the same (e.g., both the first logic gate 102 and the second logic gate 104 may be NAND logic gates as illustrated in FIGS. 3A-6) or may be different (e.g., the first logic gate 102 may be a NAND logic gate while the second logic gate 104 is an AND logic gate). Various embodiments are described below in the context of arrangements where the first logic gate 102 and the second logic gate 104 are of a same type (e.g., where both the logic gate 102 and the logic gate 104 are NAND logic gates). It should be appreciated, however, that embodiments are more generally applicable to sharing pitch between at least two logic gates of a same or different type.

Further, while FIG. 1 shows an example of a vertical transport logic cell 100 that includes just two logic gates (e.g., first logic gate 102 and second logic gate 104), embodiments are not so limited. In some embodiments, a vertical transport logic cell 100 may include more than two logic gates, where at least two of the logic gates include at least one shared pitch.

Figure 2:
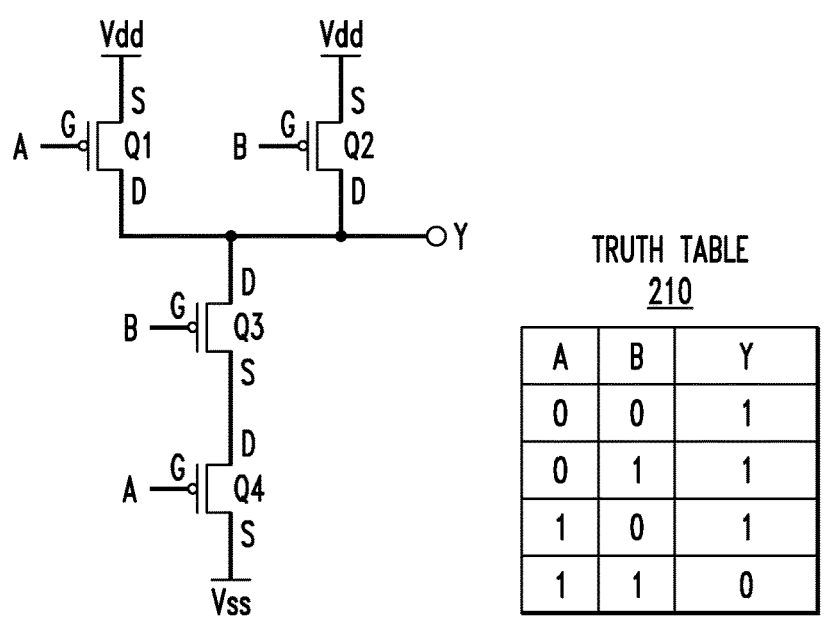
FIG. 2 depicts a circuit diagram of a NAND logic gate cell, according to an embodiment of the invention.

FIG. 2 shows a circuit diagram 200 of a typical NAND circuit. The NAND circuit 200 is a 2-input NAND gate, including two p-channel FETs (PFETs) denoted Q1 and Q2 and connected in parallel, and two n-channel FETs (NFETs) denoted Q3 and Q4 and connected in series. The NAND circuit 200 thus includes first and second PFET transistors Q1 and Q2 having their gate (G) inputs coupled to input terminals A and B, respectively. The first PFET transistor Q1 and second PFET transistor Q2 further have their drains (D) connected to output terminal (Y), and their sources (S) connected to positive supply voltage Vdd. The NAND circuit 200 also includes a first NFET transistor Q3 and a second NFET transistor Q4 having their gate (G) inputs coupled to input terminals B and A, respectively. The drain (D) of the first NFET transistor Q3 is connected to the output terminal (Y), and the source (S) of the first NFET transistor Q3 is connected to the drain (D) of the second NFET transistor Q4. The source (S) of the second NFET transistor G4 is coupled to negative supply voltage or ground Vss.

As shown in FIG. 2, the NAND circuit 200 has a single output terminal (Y), together with two logic inputs terminals (A and B). FIG. 2 also shows a truth table 210 for the NAND circuit 200 for the logic state of output Y given the logic states of inputs A and B. As shown in the truth table 210, if either of inputs A or B is (or both of inputs A and B are) at logic low (logic '0' or Vss), the output Y is at logic high (logic '1' or Vdd). The only time the output is a logic low is when both inputs A and B are at logic highs.

The circuit 200 and truth table 210 in FIG. 2 is shown for illustrative purposes only in order to understand the main parts of the cell layout in FIGS. 3A through 6. Embodiments are therefore not limited to any particular type of logic gate, cell or circuit.

Turning now to FIG. 3A, a plan view 300 of a NAND2 circuit cell is shown, including a first NAND logic gate circuit cell (labeled NAND A) and a second NAND logic gate circuit cell (labeled NAND B). Dashed lines denote the boundaries of NAND A circuit cell and the NAND B circuit cell. The NAND A and NAND B circuit cells shown in FIG. 3A are each assumed to be electrically laid out as shown in the NAND circuit diagram 200 of FIG. 2. The first and second PFETs of the NAND A cell are labeled Q1 and Q2, and the first and second NFETs of the NAND A cell are labeled Q3 and Q4. Similarly, the first and second PFETs of the NAND B cell are labeled Q1' and Q2', and the first and second NFETs of the NAND B cell are labeled Q3' and Q4'.

Note also that the various patterned layers shown in FIG. 3A that comprise each of the transistors and corresponding interconnects and cell straps are included for illustrative purposes only. Not all layers in the given cell are shown in this plan layout for purposes of simplicity, and layers may not be shown in actual proportion to or orientation with one another. The focus of various illustrative embodiments described herein is on the shared pitch area between the two logic gates (e.g., NAND A and NAND B). Accordingly, these other patterned layers are not described in detail since one of ordinary skill in cell layout library and semiconductor processing arts will fully understand which layers shown in FIG. 3A (and layouts in subsequent FIGS. 4A through 6) comprise gate, drain, source terminals, as well as other connections, for each transistor in each NAND gate.

As shown in FIG. 3A, the transistors Q1, Q2, Q3 and Q4 of the NAND A cell occupy an area of two CPPs. The NAND A cell further includes output (Y) which occupies an area of one CPP. Thus, the total area of the NAND A cell is three CPPs. Similarly, the transistors Q1', Q2', Q3' and Q4' of the NAND B cell occupy an area of two CPPs. The NAND B cell further includes an output (Y') which occupies an area of one CPP. In a conventional NAND2 cell layout, the NAND2 cell would thus require a total of six CPPs. According to an illustrative embodiment, the improved layout illustrated in plan view 300 of FIG. 3A requires only five CPPs due to the use of a shared pitch 304 for the output (Y) of the NAND A cell and the output (Y') of the NAND B cell. The improved layout illustrated in plan view 300 of FIG. 3A thus provides an area savings of ⅙, or approximately 17% relative to a conventional layout.

FIG. 3B illustrates a cross-sectional view taken along the line H-H of the layout of the NAND2 circuit cell shown in the plan view 300 of FIG. 3A. The output (Y) of the NAND A circuit cell is connected to the drains of transistors Q1, Q2 and Q3, and extends into the shared pitch area 304 via metal lines in a first metal layer 310 as shown in FIGS. 3A and 3B. Similarly, the output (Y') of the NAND B circuit cell is connected to the drains of transistors Q1', Q2' and Q3', and extends into the shared pitch area via metal lines in the first metal layer 310 as shown in FIGS. 3A and 3B. It is to be appreciated that first metal layer 310 corresponds to the "M1 layer" which is typically the first metallization layer deposited as the integrated circuit is built up from the substrate (so M1 is typically the lowest metallization layer).

In order to isolate the output (Y) of the NAND A circuit cell from the output (Y') of the NAND B circuit cell in the shared pitch area 304, a set of cell straps 302-1 through 302-4 are used. Cell strap 302-1 connects the drains of Q1 and Q2 in the NAND A cell to trench silicide (TS) layer 306 (interconnect layer). Cell strap 302-2 connects the drain of Q3 in the NAND A cell to TS layer 306. Thus, the output (Y) for NAND A cell connects the drains of Q1, Q2 and Q3 via metal lines in the first metal layer 310, cell straps 302-1 and 302-2, and TS layer 306. Cell strap 302-3 connects the drains of Q1' and Q2' in the NAND B cell to a metal line in a second metal layer 308. Note that second metal layer 308 corresponds to the "M2 layer" which is typically the next metallization layer to be deposited as the integrated circuit is built up from the substrate (so M2 layer is typically above M1 layer). Cell strap 302-4 connects the drain of Q3' in the NAND B cell to the metal line in the second metal layer 308. Thus, the output (Y') for NAND B cell connects the drains of Q1', Q2' and Q3' via metal lines in the first metal layer 310, cell straps 302-3 and 302-4, and a metal line in the second metal layer 308. In this way, the outputs of logic gates for the NAND A and NAND B circuit cells overlap one another but remain electrically isolated from each other in the shared pitch area 304.

Figure 4B:
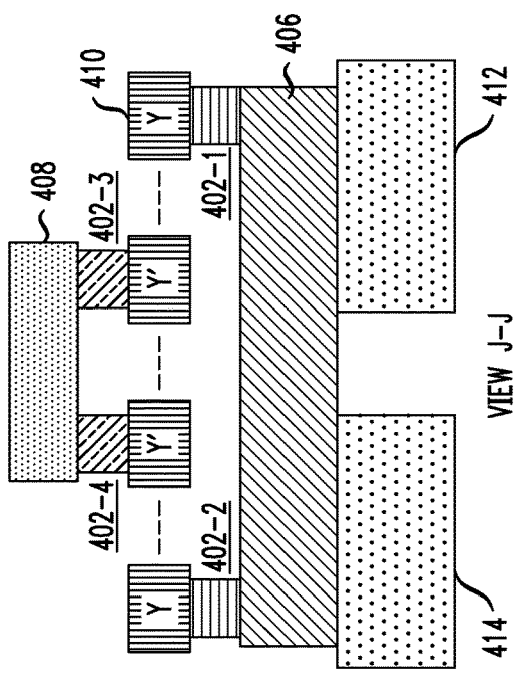
FIG. 4B depicts a cross-sectional view taken along the line J-J in the plan view of the NAND2 cell of FIG. 4A, according to an embodiment of the invention.
Figure 4A:
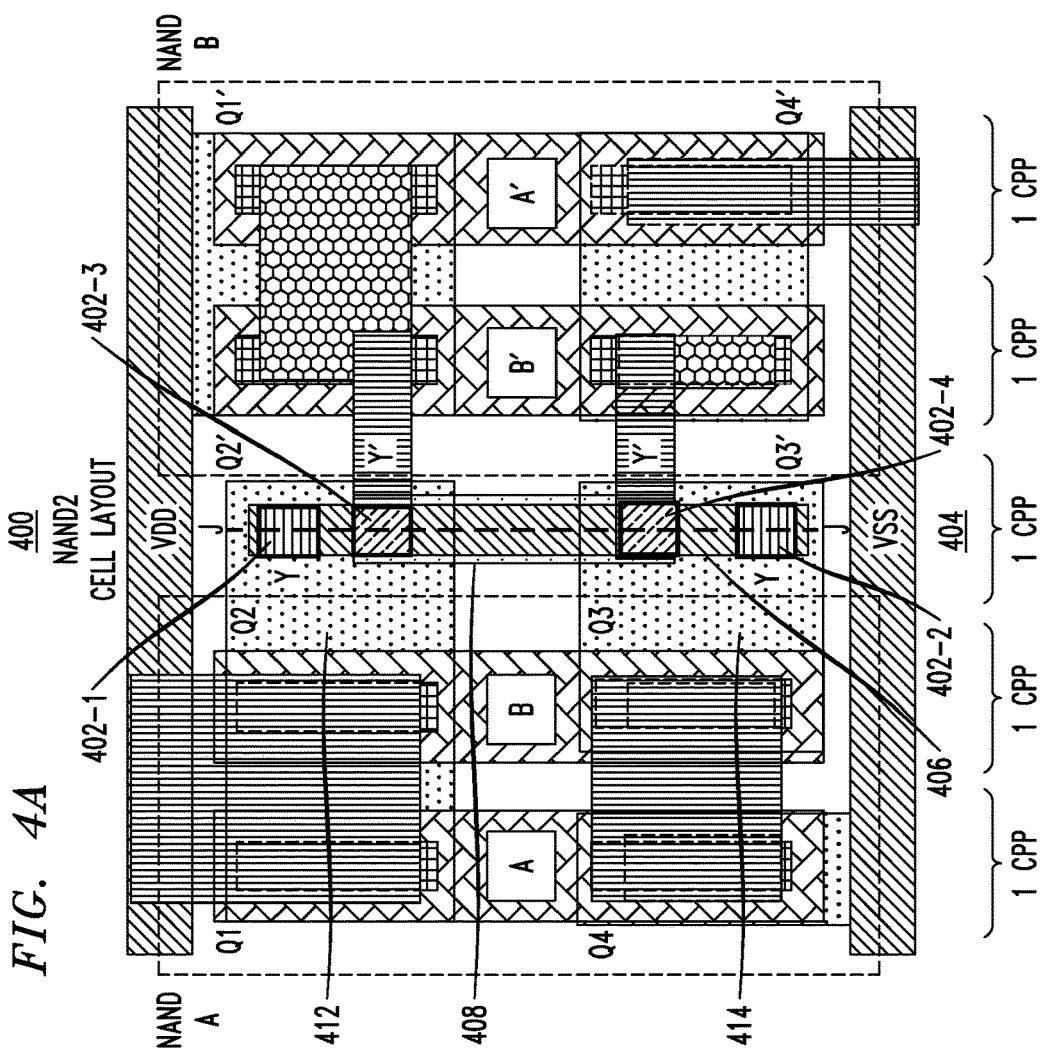
FIG. 4A depicts a plan view of another layout of a NAND2 cell, according to an embodiment of the invention.

FIG. 4A shows a plan view 400 of a NAND2 circuit cell, illustrating another improved layout. The NAND2 circuit cell of FIG. 4A, similar to the NAND2 circuit cell of FIG. 3A, includes a first NAND A logic gate circuit cell and a second NAND B logic gate circuit cell, where the dashed outlines of the NAND A circuit cell and the NAND B circuit cell indicate the boundary areas of the NAND A circuit cell and the NAND B circuit cell. The NAND A and NAND B circuit cells shown in FIG. 4A, similar to the NAND A and NAND B circuit cells shown in FIG. 3A, are each assumed to be structured as shown in the NAND circuit diagram 200 of FIG. 2. Again, the first and second PFETs of the NAND A cell are labeled Q1 and Q2, the first and second NFETs of the NAND A cell are labeled Q3 and Q4, the first and second PFETs of the NAND B cell are labeled Q1' and Q2', and the first and second NFETs of the NAND B cell are labeled Q3' and Q4'.

Similar to FIG. 3A, the transistors Q1, Q2, Q3 and Q4 of the NAND A cell in FIG. 4A occupy a pitch area of two CPPs, with the output (Y) occupying a pitch area of one CPP for a total of three CPPs. Also similar to FIG. 3A, the transistors Q1', Q2', Q3' and Q4' of the NAND B cell in FIG. 4A occupy a pitch area of two CPPs, with the output (Y') occupying a pitch area of one CPP for a total of three CPPs. As discussed above with respect to FIG. 3A, in a conventional layout such a NAND2 cell would thus require a total of six CPPs. The improved layout illustrated in plan view 400 of FIG. 4A, however, requires only five CPPs due to the use of a shared pitch area 404 for the output (Y) of the NAND A cell and the output (Y') of the NAND B cell. The improved layout illustrated in plan view 400 of FIG. 4A thus provides an area savings of ⅙, or approximately 17% relative to a conventional layout.

The plan view 400 of FIG. 4A differs from the plan view 300 of FIG. 3A in the way in which the drains of transistors Q1, Q2 and Q3 are connected to the shared pitch area. In the plan view 400, a conductive layer 412 connects the drains of transistors Q1 and Q2 to the shared pitch area 404 (as compared to the plan view 300, where metal lines in the first metal layer 310 connect the drains of transistors Q1 and Q2 to the shared pitch area 304). Also, in the plan view 400, a conductive layer 414 connects the drain of transistor Q3 to the shared pitch area (as compared to the plan view 300, where a metal line in the first metal layer 310 connects the drain of transistor Q3 to the shared pitch area 304).

FIG. 4B shows a cross-sectional view taken along the line J-J of the layout of the NAND2 circuit cell shown in the plan view 400 of FIG. 4A. The output (Y) of the NAND A circuit cell is connected to the drains of transistors Q1, Q2 and Q3, and extends into the shared pitch area 404 via conductive layers 412 and 414 as shown in FIGS. 4A and 4B. The output (Y') of the NAND B circuit cell is connected to the drains of transistors Q1', Q2' and Q3', and extends into the shared pitch area via metal lines in the first metal layer 410 as shown in FIGS. 4A and 4B.

In order to electrically isolate the output (Y) of the NAND A circuit cell from the output (Y') of the NAND B circuit cell in the shared pitch area 404, a set of cell straps 402-1 through 402-4 are used. Cell straps 402-1 and 402-2 connect metal ports in the first metal layer 410 to TS layer 406, which is connected to the conductive layers 412 and 414. It is to be appreciated that conductive layers 412 and 414 are part of a diffusion layer which is the layer connecting to the bottom of the vertical transistor source/drain. Cell strap 402-3 connects the drains of Q1' and Q2' in the NAND B cell to a metal line in a second metal layer 408. Cell strap 402-4 connects the drain of Q3' in the NAND B cell to the metal line in the second metal layer 408. Thus, the output (Y') for NAND B cell connects the drains of Q1', Q2' and Q3' via metal lines in the first metal layer 410, cell straps 402-3 and 402-4, and a metal line in the second metal layer 408. In this way, the outputs of logic gates for the NAND A and NAND B circuit cells overlap one another but remain isolated from each other in the shared pitch area 404. Note that the metal layer 410 in FIG. 4B is for connection external to the logic cell 400.

Figure 5:
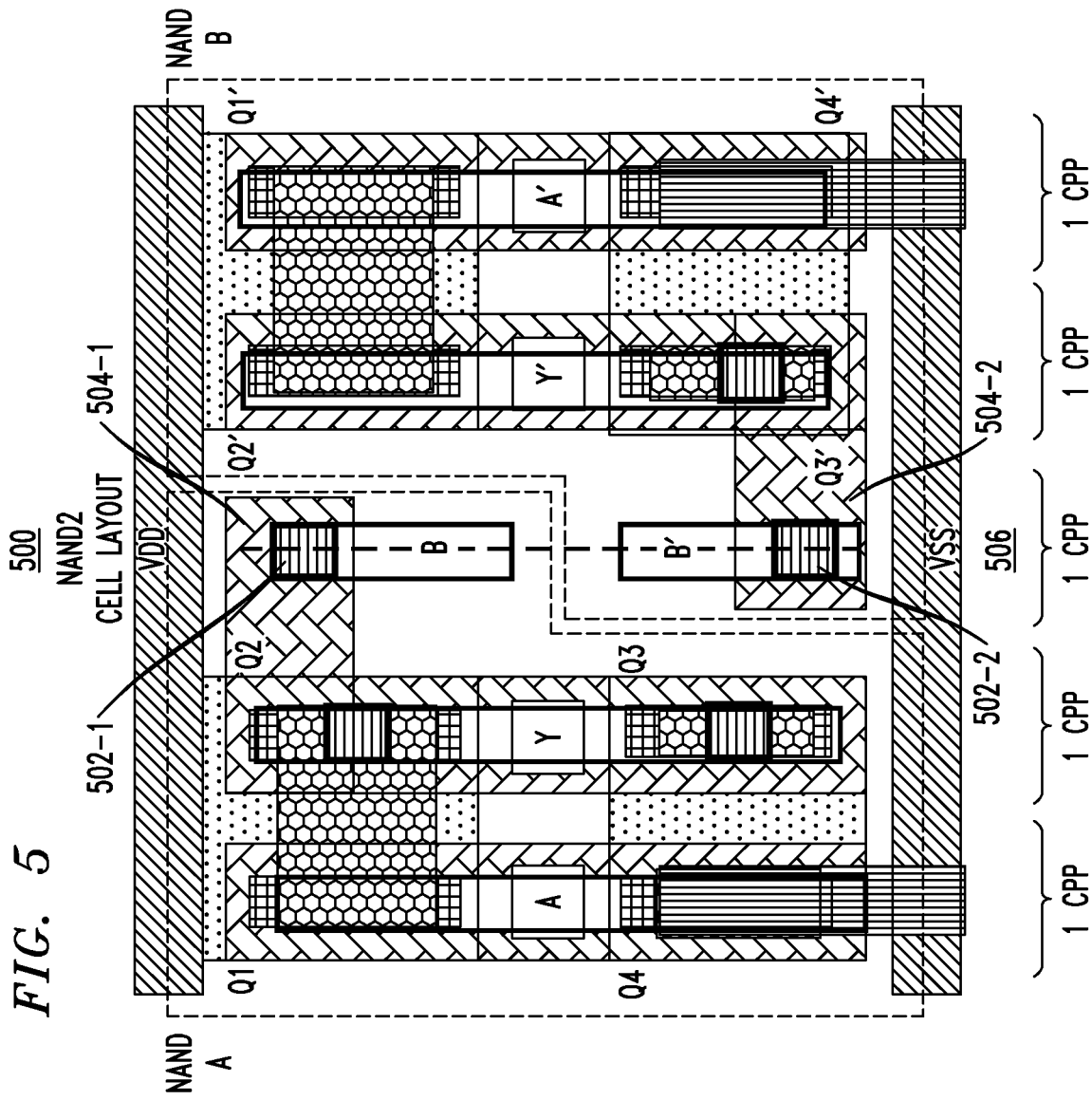
FIG. 5 depicts a plan view of a further layout of a NAND2 cell, according to an embodiment of the invention.
Figure 6:
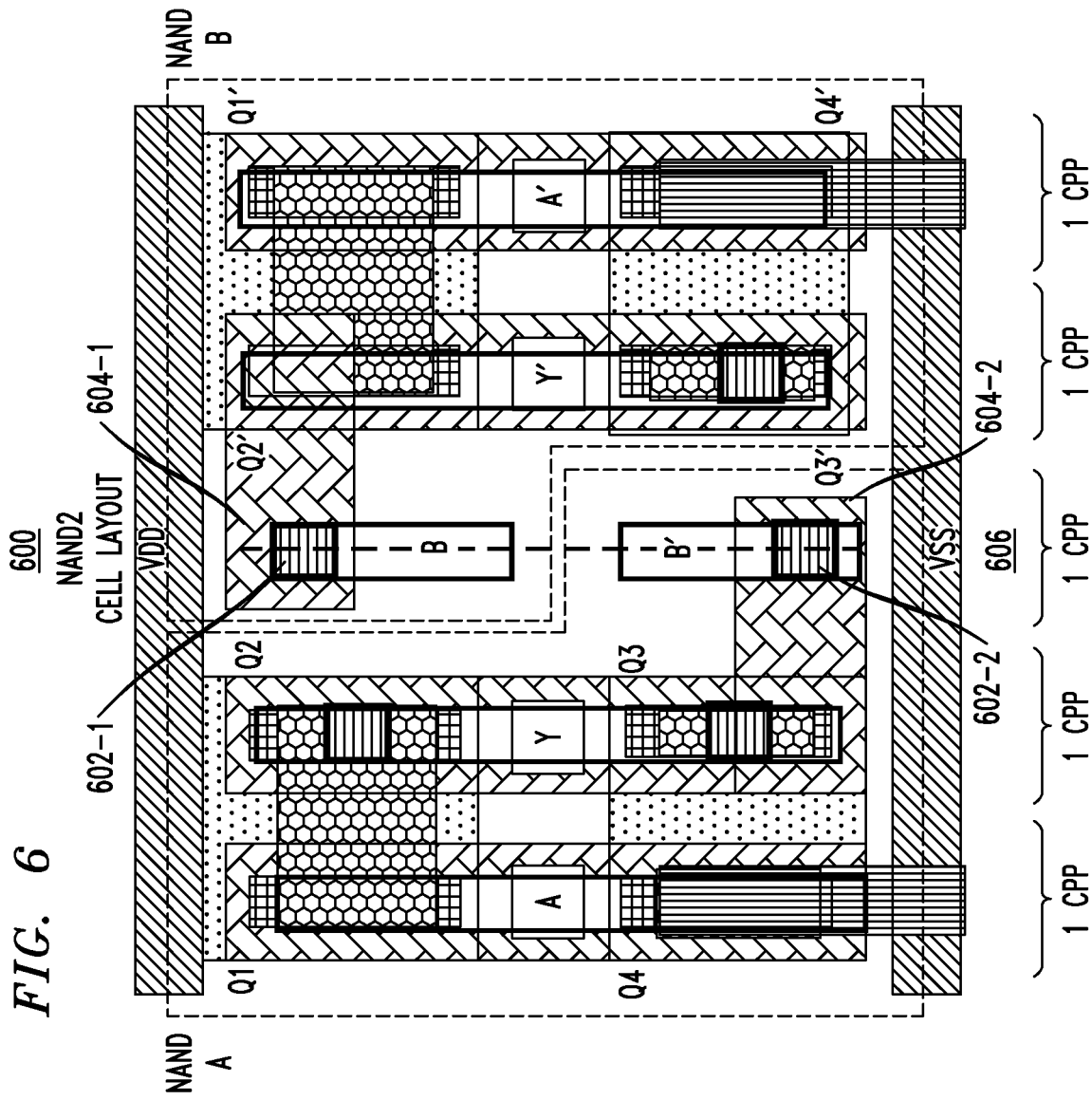
FIG. 6 depicts a plan view of yet another layout of a NAND2 cell, according to an embodiment of the invention.

While illustrative embodiments described above in the context of FIGS. 3A/3B and FIGS. 4A/4B depict output terminals of multiple logic gates sharing a common CPP, illustrative embodiments described below in the context of FIGS. 5 and 6 depict input terminals of multiple logic gates sharing a common CPP.

More particularly, FIG. 5 shows a plan view 500 of another NAND2 circuit cell, illustrating another improved layout. The NAND2 circuit cell of FIG. 5, similar to the NAND2 circuit cells of FIGS. 3A and 4A, includes a first NAND A logic gate circuit cell and a second NAND B logic gate circuit cell, where the dashed outlines of the NAND A circuit cell and the NAND B circuit cell indicate the boundary areas of the NAND A circuit cell and the NAND B circuit cell. The NAND A and NAND B circuit cells shown in FIG. 5, similar to the NAND A and NAND B circuit cells shown in FIGS. 3A and 4A, are each assumed to be structured as shown in the NAND circuit diagram 200 of FIG. 2. Again, the first and second PFETs of the NAND A cell are labeled Q1 and Q2, the first and second NFETs of the NAND A cell are labeled Q3 and Q4, the first and second PFETs of the NAND B cell are labeled Q1' and Q2', and the first and second NFETs of the NAND B cell are labeled Q3' and Q4'.

Whereas the layouts show in plan views 300 and 400 of FIGS. 3A and 4A improved the layout by having the outputs of NAND A and NAND B circuit cells sharing common pitch areas 304 and 404, respectively, the layout shown in plan view 500 of FIG. 5 has complementary inputs of the NAND A and NAND B circuit cells sharing a common pitch area 506. Thus, the layout of the NAND2 cell in plan view 500 of FIG. 5 requires only a total of five CPPs due to the use of shared pitch area 506 for the input (B) of the NAND A cell and the input (B') of the NAND B cell. The improved layout in plan view 500 of FIG. 5 thus provides an area savings of ⅙, or approximately 17% relative to a conventional layout without the use of shared pitch area 506.

As shown in the plan view 500 of FIG. 5, the NAND A circuit cell uses one part of the shared CPP in shared pitch area 506 for the input pin B, while the NAND B circuit cell uses another part of the shared CPP in shared pitch area 506 for the input pin B'. Thus, in contrast to output terminals sharing a common pitch in FIGS. 3A/3B and 4A/4B by vertically overlapping the output terminals in upper and lower vertical portions of the common pitch (as illustrated in the cross-section views of FIGS. 3B and 4B, respectively), there is no need to overlap the input terminals in the shared pitch area 506 in the embodiment of FIG. 5. Input pins B and B' may be formed on a first metal layer (M1) that connects to extended gate connections 504-1 and 504-2 from transistors Q2 and Q3', respectively. The extended gates 504-1 and 504-2 may be comprised of poly (PC) and connect to the input pins B and B' via metal to poly contacts 502-1 and 502-2, respectively.

FIG. 6 shows a plan view 600 of a NAND2 circuit cell, illustrating another improved layout. The NAND2 circuit cell of FIG. 6, similar to the NAND2 circuit cells of FIGS. 3A, 4A and 5, includes a first NAND A logic gate circuit cell and a second NAND B logic gate circuit cell, where the dashed outlines of the NAND A circuit cell and the NAND B circuit cell indicate the boundary areas of the NAND A circuit cell and the NAND B circuit cell. The NAND A and NAND B circuit cells shown in FIG. 6, similar to the NAND A and NAND B circuit cells shown in FIGS. 3A, 4A and 5, are each assumed to be structured as shown in the NAND circuit diagram 200 of FIG. 2. Again, the first and second PFETs of the NAND A cell are labeled Q1 and Q2, the first and second NFETs of the NAND A cell are labeled Q3 and Q4, the first and second PFETs of the NAND B cell are labeled Q1' and Q2', and the first and second NFETs of the NAND B cell are labeled Q3' and Q4'.

The layout show in plan view 600 of FIG. 5, similar to the layout shown in plan view 500 of FIG. 5, illustrates an improved layout with complementary inputs of the NAND A and NAND B circuit cells sharing a common pitch area 604. Thus, the layout of the NAND2 cell in plan view 600 of FIG. 6 requires only a total of five CPPs due to the use of shared pitch area 604 for the input (B) of the NAND A cell and the input (B') of the NAND B cell. The improved layout in plan view 600 of FIG. 5 thus provides an area savings of ⅙, or approximately 17% relative to a conventional layout without the use of shared pitch area 604.

Compared with the plan view 500 of the FIG. 5, the plan view 600 of FIG. 6 shows a layout where the input pins B and B' are swapped to accommodate a different router pin access direction. Thus, in the plan view 600 of FIG. 6, the NAND B circuit cell uses one portion of the CPP in shared pitch area 606 for the input pin B', while the NAND A circuit cell uses another portion of the CPP in shared pitch area 606 for the input pin B. Input pins B' and B may be formed on a first metal layer that connects to extended gate connections 604-1 and 604-2 from transistors Q2' and Q3, respectively. The extended gates 604-1 and 604-2 may be comprised of poly (PC) and connect to the input pins B' and B via metal to poly contacts 602-1 and 602-2, respectively.

Again, it is to be understood that the various embodiments in FIGS. 3A through 6 which comprise various improved layouts NAND2 logic cells are intended to be exemplary implementations since alternative embodiments may have different types of logic gates sharing a common pitch to form vertical transport FET circuit structures. Also, it is to be understood that a given integrated circuit layout in accordance with one or more illustrative embodiments has multiple sets of logic gates with a shared pitch (e.g., multiple vertical transport logic circuit cells).

Furthermore, vertical transport FET circuit structures may be fabricated using conventional methods, but with the improved layouts described herein. For example, the substrate on which the VTFETs are supported, although not shown in the figures for simplicity, can comprise a semiconductor substrate, specifically a silicon-based, single crystalline material doped either n-type or p-type. Arranged on the upper surface of the substrate can be various isolation structures (not shown), including the circuits herein disclosed. Isolation structures can be formed, for example, by a shallow trench process. In either event, isolation structures serve to isolate an active or passive device in one portion of substrate from an active or passive device within another portion of substrate.

The width of the contact trenches can generally vary. For example, the width of the contact trenches can be in a range from about 15 to about 100 nanometers (nm), specifically about 20 to about 50 nm. Contacts within the trenches can include any material, or combination of materials, that provide a low contact resistance (e.g., a contact resistance lower than $1\times10^{-8}$ ohm-cm$^2$) when deposited. Such contacts can be formed by a chemical vapor deposition process (CVD), atomic layer deposition (ALD), or other suitable process. The total thickness of the contacts can vary and is not intended to be limited. For example, the total thickness of the contacts can be in a range from about 1 to about 15 nm.

Contacts for the source/drain regions can be formed with a contact metal. Non-limiting examples of suitable contact metals include aluminum, platinum, gold, tungsten, titanium, or any combination thereof. Such contact metal can be deposited by a known deposition process, for example, CVD, plasma-enhanced chemical vapor deposition (PECVD), physical vapor deposition (PVD), plating, thermal or e-beam evaporation, and sputtering. The contact metal of the NFET (first VTFET transistor) can be the same or different from the contact element in the PFET (second VTFET).

Source regions and drain regions can be formed by, for example, an epitaxial growth process that deposits a crystalline layer onto the crystalline substrate beneath. In some embodiments, epitaxial silicon, silicon germanium, and/or carbon doped silicon (SiC) can be doped during deposition by adding a dopant or impurity to form a silicide. The epitaxial source/drain can be doped with an n-type dopant or a p-type dopant, which depends on the type of transistor.

Alternatively, the source/drain regions can be formed by incorporating dopants into the substrate.

In vertical FETs, the gate metal/poly deposition can be performed around a vertical pillar that forms the source/channel/drain. The gate structure includes a high-k gate dielectric. High-k dielectric material(s) can be a dielectric material having a dielectric constant greater than about 4.0, about 7.0, or about 10.0. Examples of suitable materials for the high-k dielectric material include, but are not limited to, oxides, nitrides, oxynitrides, silicates (e.g., metal silicates), aluminates, titanates, nitrides, or any combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, or any combination thereof. The high-k material may further include dopants such as, for example, lanthanum and aluminum.

The high-k dielectric material layer can be formed by any known deposition process such as, for example, CVD, PECVD, ALD, evaporation, PVD, chemical solution deposition, or other like processes. The thickness of the high-k dielectric material may vary depending on the deposition process as well as the composition and number of high-k dielectric materials used. The high-k dielectric material layer may have a thickness in a range from about 0.5 to about 20 nm.

Work function metals, including polysilicon, for a gate can be disposed over the high-k dielectric material layer. The type of work function metal can depend on the type of transistor and may differ between the NFET and the PFET. Examples of suitable work function metals include, but are not limited to, p-type work function metal materials and n-type work function metal materials. P-type work function materials can include compositions such as ruthenium, palladium, platinum, cobalt, nickel, and conductive metal oxides, or any combination thereof. N-type metal materials can include compositions such as hafnium, zirconium, titanium, tantalum, aluminum, metal carbides (e.g., hafnium carbide, zirconium carbide, titanium carbide, and aluminum carbide), aluminides, or any combination thereof.

Conventional methods for forming the conductive elements, tracks thereto, and via elements in the circuits are contemplated. One or more layers of inter-level dielectric materials can be deposited between circuit levels. Openings or via elements can be formed through the inter-level dielectrics and filled with a conductive material, as will be understood by the skilled artisan.

In the description above, various materials and dimensions for different elements are provided. Unless otherwise noted, such materials are given by way of example only and embodiments are not limited solely to the specific examples given. Similarly, unless otherwise noted, all dimensions are given by way of example and embodiments are not limited solely to the specific dimensions or ranges given.

Semiconductor devices and methods for forming same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, complementary metal-oxide-semiconductors (CMOSs), metal-oxide-semiconductor field-effect transistors (MOSFETs), and/or fin field-effect transistors (FinFETs). By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
a vertical transport logic circuit cell comprising a first logic gate and at least a second logic gate positioned in an overlapping configuration, the first logic gate comprising at least one input terminal and at least one output terminal; the second logic gate comprising at least one input terminal and at least one output terminal;
wherein one of the input terminal and the output terminal of the first logic gate shares a pitch of the vertical transport logic circuit cell with one of the input terminal and the output terminal of the second logic gate.

2. The semiconductor structure of claim 1, wherein the pitch is a contacted polysilicon pitch.

3. The semiconductor structure of claim 1, wherein, when the input terminal of the first logic gate and the input terminal of the second logic gate share a pitch of the vertical transport logic circuit cell, the first logic gate uses an upper vertical portion of the shared pitch and the second logic gate uses a lower vertical portion of the shared pitch.

4. The semiconductor structure of claim 1, wherein, when the input terminal of the first logic gate and the input terminal of the second logic gate share a pitch of the vertical transport logic circuit cell, the first logic gate uses a lower vertical portion of the shared pitch and the second logic gate uses an upper vertical portion of the shared pitch.

5. The semiconductor structure of claim 1, wherein, when the output terminal of the first logic gate and the output terminal of the second logic gate share the pitch of the vertical transport logic circuit cell, the first logic gate uses a conductive layer below an interconnect layer for an output terminal with a cell strap and the second logic gate uses a conductive layer above the interconnect layer with a cell strap for an output terminal.

6. The semiconductor structure of claim 1, wherein, when the first logic gate comprises at least one p-type field effect transistor and at least one n-type field effect transistor, the p-type field effect transistor is connected to the n-type field effect transistor using a cell strap.

7. The semiconductor structure of claim 6, wherein, when the second logic gate comprises at least one p-type field effect transistor and at least one n-type field effect transistor, the p-type field effect transistor is connected to the n-type field effect transistor using a given metallization layer.

8. The semiconductor structure of claim 1, wherein the vertical transport logic circuit cell comprises two or more of the same type of logic gate.

9. The semiconductor structure of claim 1, wherein the vertical transport logic circuit cell comprises two or more different types of logic gates.

10. The semiconductor structure of claim 1, wherein the vertical transport logic circuit cell comprises a NAND2 logic circuit such that the first logic gate is a first NAND gate and the second logic gate is a second NAND gate.

11. An integrated circuit, comprising:
one or more vertical transport logic circuit cells, wherein at least one of the one or more vertical transport logic circuit cells comprises a first logic gate and at least a second logic gate positioned in an overlapping configuration, the first logic gate comprising at least one input terminal and at least one output terminal; the second logic gate comprising at least one input terminal and at least one output terminal;
wherein one of the input terminal and the output terminal of the first logic gate shares a pitch of the vertical transport logic circuit cell with one of the input terminal and the output terminal of the second logic gate.

12. The integrated circuit of claim 11, wherein the pitch is a contacted polysilicon pitch.

13. The integrated circuit of claim 11, wherein, when the input terminal of the first logic gate and the input terminal of the second logic gate share a pitch of the vertical transport logic circuit cell, the first logic gate uses an upper vertical portion of the shared pitch and the second logic gate uses a lower vertical portion of the shared pitch.

14. The integrated circuit of claim 11, wherein, when the input terminal of the first logic gate and the input terminal of the second logic gate share a pitch of the vertical transport logic circuit cell, the first logic gate uses a lower vertical portion of the shared pitch and the second logic gate uses an upper vertical portion of the shared pitch.

15. The integrated circuit of claim 11, wherein, when the output terminal of the first logic gate and the output terminal of the second logic gate share the pitch of the vertical transport logic circuit cell, the first logic gate uses a conductive layer below an interconnect layer for an output terminal with a cell strap and the second logic gate uses another conductive layer above the interconnect layer with a cell strap for an output terminal.

16. The integrated circuit of claim 11, wherein, when the first logic gate comprises at least one p-type field effect transistor and at least one n-type field effect transistor, the p-type field effect transistor is connected to the n-type field effect transistor using a cell strap.

17. The integrated circuit of claim 16, wherein, when the second logic gate comprises at least one p-type field effect transistor and at least one n-type field effect transistor, the p-type field effect transistor is connected to the n-type field effect transistor using a given metallization layer.

18. The integrated circuit of claim 11, wherein the vertical transport logic circuit cell comprises two or more of the same type of logic gate.

19. The integrated circuit of claim 11, wherein the vertical transport logic circuit cell comprises two or more different types of logic gates.

20. The integrated circuit of claim 11, wherein the vertical transport logic circuit cell comprises a NAND2 logic circuit such that the first logic gate is a first NAND gate and the second logic gate is a second NAND gate.

21. A method for fabricating a semiconductor structure, comprising:
in a vertical transport logic circuit cell comprising a first logic gate and at least a second logic gate positioned in an overlapping configuration, wherein the first logic gate comprises at least one input terminal and at least one output terminal, and the second logic gate comprises at least one input terminal and at least one output terminal;
sharing a pitch of the vertical transport logic circuit cell between one of the input terminal and the output terminal of the first logic gate and one of the input terminal and the output terminal of the second logic gate.

22. The method of claim 21, wherein the pitch is a contacted polysilicon pitch.

23. The method of claim 21, wherein at least one of the first logic gate and the second logic gate comprise: an inverter logic gate; a NAND logic gate; an AND logic gate; a NOR logic gate; an OR logic gate; an AND-OR logic gate; an OR-AND logic gate; a buffer; a flip-flop; and a multiplexer.

24. A semiconductor structure, comprising:
a vertical transport logic circuit cell comprising a first logic gate and at least a second logic gate positioned in an overlapping configuration;
wherein the first logic gate and the second logic gate share a pitch of the vertical transport logic circuit cell.

25. The semiconductor structure of claim 24, wherein the pitch is a contacted polysilicon pitch.

* * * * *